United States Patent [19]
Ando

[11] Patent Number: 5,418,863
[45] Date of Patent: May 23, 1995

[54] IMAGING CODING DEVICE

[75] Inventor: Tsutomu Ando, Zama, Japan

[73] Assignee: Canon Kabushiki Kaisha, Tokyo, Japan

[21] Appl. No.: 97,899

[22] Filed: Jul. 28, 1993

[30] Foreign Application Priority Data

Jul. 31, 1992 [JP] Japan .................................. 4-205539

[51] Int. Cl.⁶ ............................................. G06K 9/00
[52] U.S. Cl. ...................................... 382/56; 348/394; 358/430
[58] Field of Search ..................... 382/56; 341/75, 106; 348/390, 394, 395; 358/426, 430

[56] References Cited

U.S. PATENT DOCUMENTS 4,286,256  8/1981  Langdon, Jr. et al. ............. 340/347

FOREIGN PATENT DOCUMENTS 0381078  8/1990  European Pat. Off. .

Primary Examiner—Leo H. Boudreau
Attorney, Agent, or Firm—Fitzpatrick, Cella, Harper & Scinto

[57] ABSTRACT

An image coding device for coding image data by means of an arithmetic code detects bit positions of value "1" in a register which stores a plurality of bits of interval data representing a current coding interval used for coding image data. Subsequently, the image coding device shifts the interval data in the register according to the bit position.

16 Claims, 9 Drawing Sheets

FIG. 7

| RANGES OF A | THE NUMBER OF SHIFTS |
|---|---|
| 1 | 15 |
| 2 ~ 3 | 14 |
| 4 ~ 7 | 13 |
| 8 ~ FH | 12 |
| 10H ~ 1 FH | 11 |
| 20H ~ 3 FH | 10 |
| 40H ~ 7 FH | 9 |
| 80H ~ FFH | 8 |
| 100H ~ 1FFH | 7 |
| 200H ~ 3FFH | 6 |
| 400H ~ 7FFH | 5 |
| 800H ~ FFFH | 4 |
| 1000H ~ 1 FFFH | 3 |
| 2000H ~ 3 FFFH | 2 |
| 4000H ~ 7 FFFH | 1 |

FIG. 8

CT VALUE PRIOR TO RE-NORMALIZATION

| THE NUMBER OF SHIFTS | 1 | 2 | 3 | 4 | 5 | 6 | 7 | 8 |
|---|---|---|---|---|---|---|---|---|
| 1  | 1/8 | 0/1 | 0/2 | 0/3 | 0/4 | 0/5 | 0/6 | 0/7 |
| 2  | 1/7 | 1/8 | 0/1 | 0/2 | 0/3 | 0/4 | 0/5 | 0/6 |
| 3  | 1/6 | 1/7 | 1/8 | 0/1 | 0/2 | 0/3 | 0/4 | 0/5 |
| 4  | 1/5 | 1/6 | 1/7 | 1/8 | 0/1 | 0/2 | 0/3 | 0/4 |
| 5  | 1/4 | 1/5 | 1/6 | 1/7 | 1/8 | 0/1 | 0/2 | 0/3 |
| 6  | 1/3 | 1/4 | 1/5 | 1/6 | 1/7 | 1/8 | 0/1 | 0/2 |
| 7  | 1/2 | 1/3 | 1/4 | 1/5 | 1/6 | 1/7 | 1/8 | 0/1 |
| 8  | 1/1 | 1/2 | 1/3 | 1/4 | 1/5 | 1/6 | 1/7 | 1/8 |
| 9  | 2/8 | 1/1 | 1/2 | 1/3 | 1/4 | 1/5 | 1/6 | 1/7 |
| 10 | 2/7 | 2/8 | 1/1 | 1/2 | 1/3 | 1/4 | 1/5 | 1/6 |
| 11 | 2/6 | 2/7 | 2/8 | 1/1 | 1/2 | 1/3 | 1/4 | 1/5 |
| 12 | 2/5 | 2/6 | 2/7 | 2/8 | 1/1 | 1/2 | 1/3 | 1/4 |
| 13 | 2/4 | 2/5 | 2/6 | 2/7 | 2/8 | 1/1 | 1/2 | 1/3 |
| 14 | 2/3 | 2/4 | 2/5 | 2/6 | 2/7 | 2/8 | 1/1 | 1/2 |
| 15 | 2/2 | 2/3 | 2/4 | 2/5 | 2/6 | 2/7 | 2/8 | 1/1 |

Legend: THE NUMBER OF OUTPUT BYTES / NEW CT VALUE

IMAGING CODING DEVICE

BACKGROUND OF THE INVENTION

1. Field of the Invention

The present invention relates to an image coding device for compression coding of image data, and more particularly, to an image coding device for coding image data by means of an arithmetic code.

2. Description of the Related Art

As described in ISO/IEC (Committee Draft 11544, etc.), an arithmetic code is used for image encoding by adaptive prediction or the like.

An example of the construction of a coding circuit using the arithmetic code is illustrated in FIG. 1.

Binary data I of a target picture-element to be coded is input to an exclusive-OR gate 904. Binary data $X_0$ to $X_n$ of a plurality of reference picture-elements adjacent to the target picture-element is input to a predictive-state memory 901. The predictive-state memory 901 inputs 0 or 1 as predictive picture-element data to the exclusive-OR gate 904 in accordance with the state of the reference picture-elements data. In the exclusive-OR gate 904, examination of match/mismatch between the target picture-element data I and the predictive picture-element data from the predictive-state memory 901 is conducted, and the result of the examination is output to an arithmetic coding device 903.

The arithmetic coding device 903 is provided with an interval-size register (A-register) representing a current coding-interval and a code register (C-register), both of which are shifted in accordance with the output value of the exclusive-OR gate 904. Subsequently, a consecutive 8-bit value at a specific position in the C-register is output as code data.

The contents of the predictive-state memory 901 is updated in accordance with the direction of the predictive-state memory 901 which fetches the coded result including the value of the A-register in the arithmetic coding device 903. Consequently, the predictive picture-element data is output to the exclusive-OR gate 904 from the predictive-state memory 901 adaptively to the coding operation being executed.

FIG. 2A is a flow chart showing the coding operation of the coding device 903. Let the A-register be 32 bits and the C-register also be 32 bits in the coding device 903. By definition, the interval A ranges between 0(0000H) and 0.5(8000H) and 1.0(10000H), where H represents a hexadecimal integer.

After the comparison between data of the target picture-element and data of the predictive picture-element by the exclusive-OR gate 904, a constant LSZ (least significant coding interval) is subtracted (S201) from the value A of the A-register in the arithmetic coding device 903. The constant LSZ corresponds to the occurrence probability of a less probable symbol. Subsequently, the match/mismatch between the target picture-element and the predictive picture-element is determined (S202) in the exclusive-OR gate 904. When a match occurs, re-normalization as shown in FIG. 3 is executed. On the other hand, another re-normalization as shown in FIG. 4 is executed when a mismatch occurs. The re-normalization procedure is illustrated in FIG. 2A, in which re-normalization can be executed either when a mismatch between the target picture-element data and the predictive picture-element data occurs, or when a match between the two data occurs and the value A of the A-register is less than 0.5(8000H).

As shown in FIG. 2B, to double the respective contents of the A-register and the C-register, these registers are respectively shifted to MSB by 1 bit each, and then 1 is subtracted (S301) from a CT-counter which counts the number of shifts. In this example, to treat the code data as 8-bit parallel data, the data at a specific position in the C-register is fetched as the code data whenever the C-register has shifted 8 times. Therefore, the 8-bit code data is obtained when "8" is initially set at the CT-counter; subtraction from the set value of the CT-counter is made at every 1-bit shift of the A-register; and the value of the CT-counter becomes "0."

Accordingly, a determination (S302) is made whether the value of the CT-counter is "0" or not, in which the 8-bit code data is fetched from the C-register and output (S303) the data when the value is "0"; although outputting of the code data is not executed when the value is not "0." Subsequently, it is determined (S304) whether the 1-bit shift value A of the A-register is less than 0.5 (8000H) or not. If the value A is 0.5 (8000H) or more, this re-normalization ends; and if it is less than 0.5 (8000H), the aforementioned shift operation is repeated by returning to the step S301 to execute each 1-bit shift of the A-register and the C-register and the 1-subtraction of the CT-counter. This shift operation is executed until the value of the A2O register becomes 0.5 (8000H) or more.

A description of a state transition of the A-register in the re-normalization processing will now be given in conjunction with the examples shown in FIGS. 3 and 4. When a match between the target picture-element data and the predictive picture-element data occurs, it is determined (S203) whether the value A of the A-register is less than 0.5 (8000H) or not. When the value A is 0.5 (8000H) or more, the coding operation ends through path 2 (as shown in FIG. 2A and phase 1 and phase 2 of FIG. 3). On the other hand, when the value A of the A-register is less than 0.5 (8000H), the A-register is updated (S204) by conducting a shift operation through path 1 so as to set the value A at 0.5 (8000H) or higher. The same shift operation is also executed (S205) for the C-register. Accordingly, updating of the A-register and the C-register can be executed (as shown in phase 3 of FIG. 3), in which the value of the CT-counter which counts the number of shifts of the A-register becomes "0" and consequently a high-order byte of the C-register is output as the code data.

When a mismatch occurs between the target picture-element data and the predictive picture-element data, the shift operation of the A-register will be executed until the value A of the A-register becomes 0.5 (8000H) or more (as shown in phases 1, 2, 3, and 4 in FIG. 4). As shown in FIG. 4, the shift operation of the A-register is executed three times. This shift operation accomplishes the updating (S206) of the A-register. The same shift operation is also executed (S207) for the C-register. As shown in FIG. 4, the value of the CT-counter becomes "0" at the first shift, and consequently the high-order byte of the C-register is output as code data. After the output, the value of the CT-counter is set at "8."

Accordingly, in the coding device 903, the re-normalization accompanied by the shift operation of the A-register and the C-register for the coding operation of each target picture-element is executed. The number of shifts for the re-normalization is determined by the match/mismatch between the target picture-element data and the predictive picture-element data, and by the value A of the A-register. The number of shifts is 1 when the value A is within the range of $4000H \leq A \leq 7FFF$, and 15 when $A=0001H$. Therefore, the required period for the re-normalization is not constant, which is not suitable for synchronous coding in real time with the inputting of the target picture-element to be coded.

SUMMARY OF THE INVENTION

To this end, an object of the present invention is to provide an image coding device capable of synchronous coding in real time with the input of a target picture-element to be coded.

Another object of the present invention is to provide a coding device capable of high-speed coding operation in accordance with the arithmetic code.

A further object of the present invention is to provide a coding device which can effectively perform a coding operation according to an arithmetic code regardless of match/mismatch between a target picture-element and a predictive picture-element, and also regardless of contents of an A-register.

Still a further object of the present invention is to provide a coding device capable of high-speed re-normalization processing executed in an adaptive coding operation.

These and other objects, features, and advantages of the present invention will become more apparent from the following description of the preferred embodiment taken in conjunction with the accompanying drawings.

BRIEF DESCRIPTION OF THE DRAWINGS

FIG. 7 is a table representing the relationship between the A-register and the number of shifts.

FIG. 8 is a table representing the correlation between the number of shifts and CT values.

DESCRIPTION OF THE PREFERRED EMBODIMENT

A detailed description of the preferred embodiment of the present invention will now be given.

Figure 1:
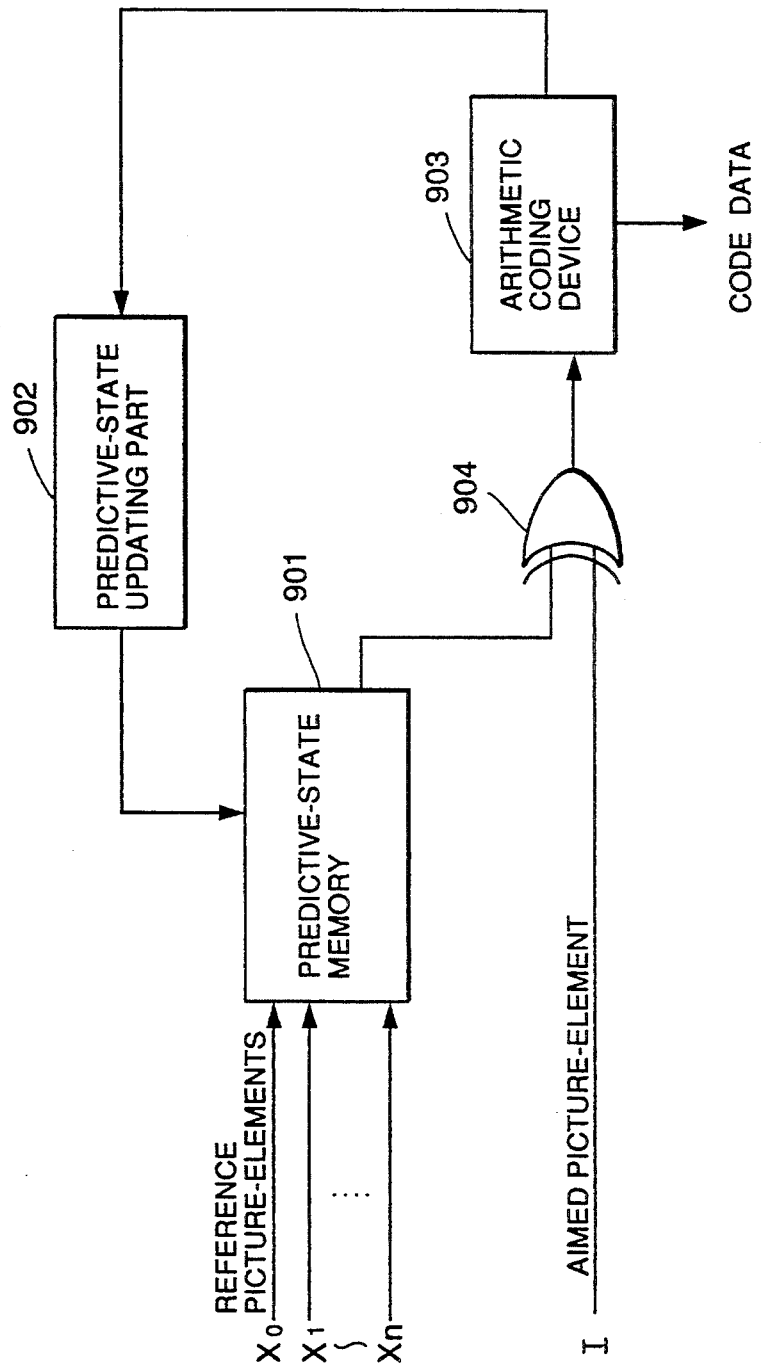
FIG. 1 is a block diagram illustrating a coding circuit using an arithmetic code.
Figure 2A:
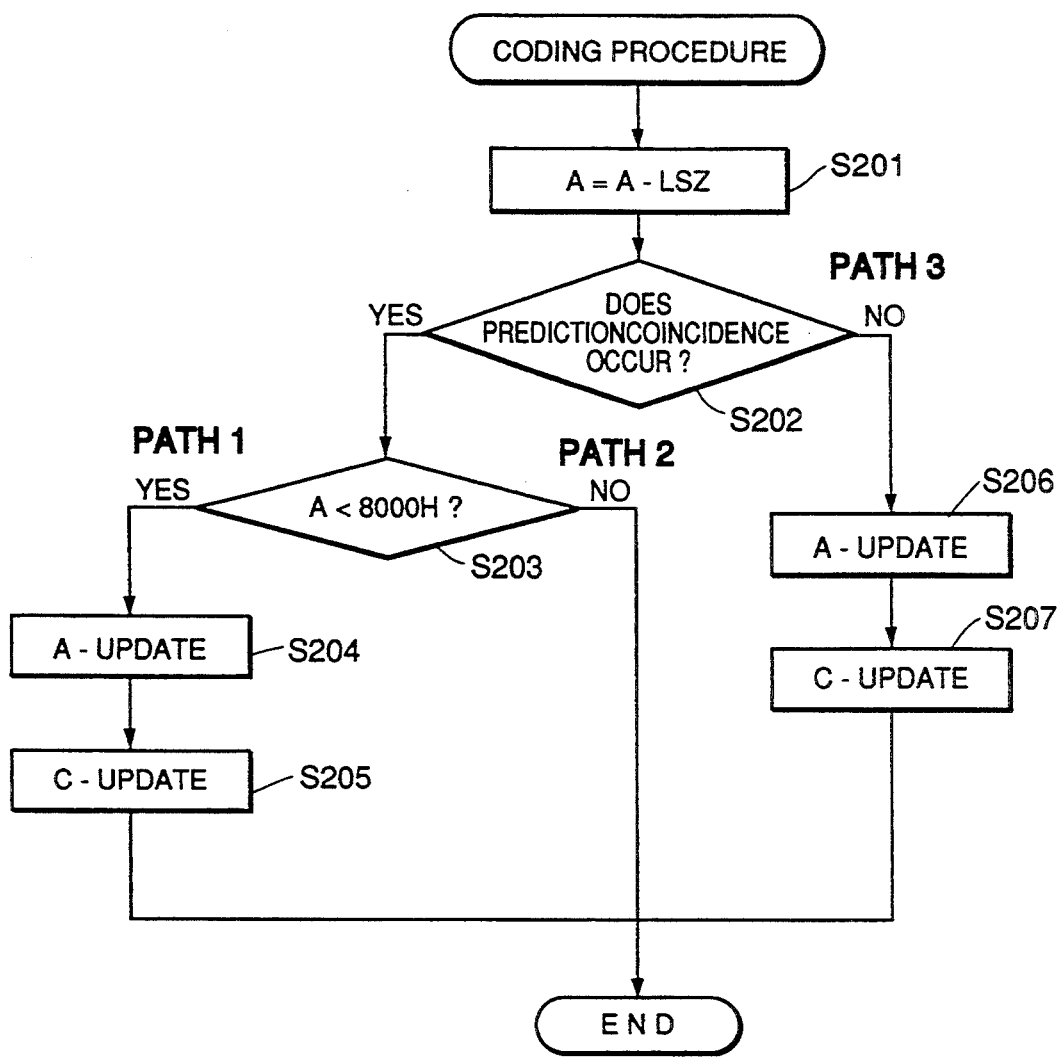
FIG. 2A is a flow chart showing a coding operation.
Figure 2B:
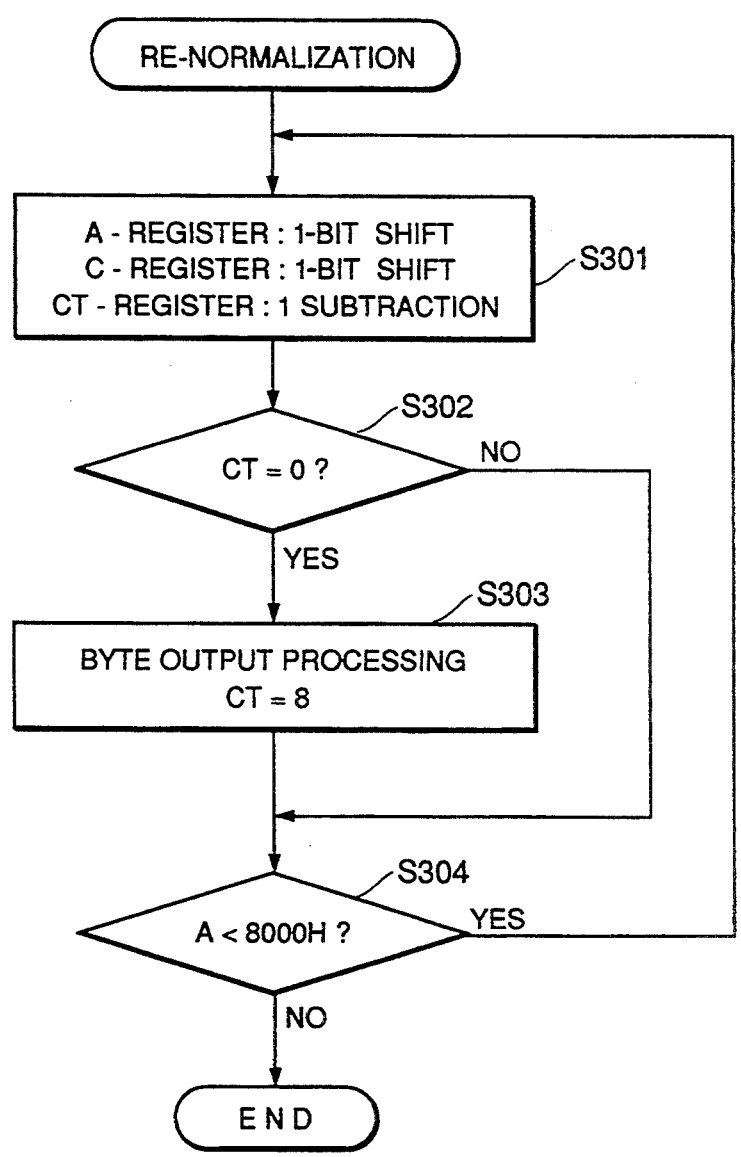
FIG. 2B is a flow chart showing re-normalization processing.
Figure 3:
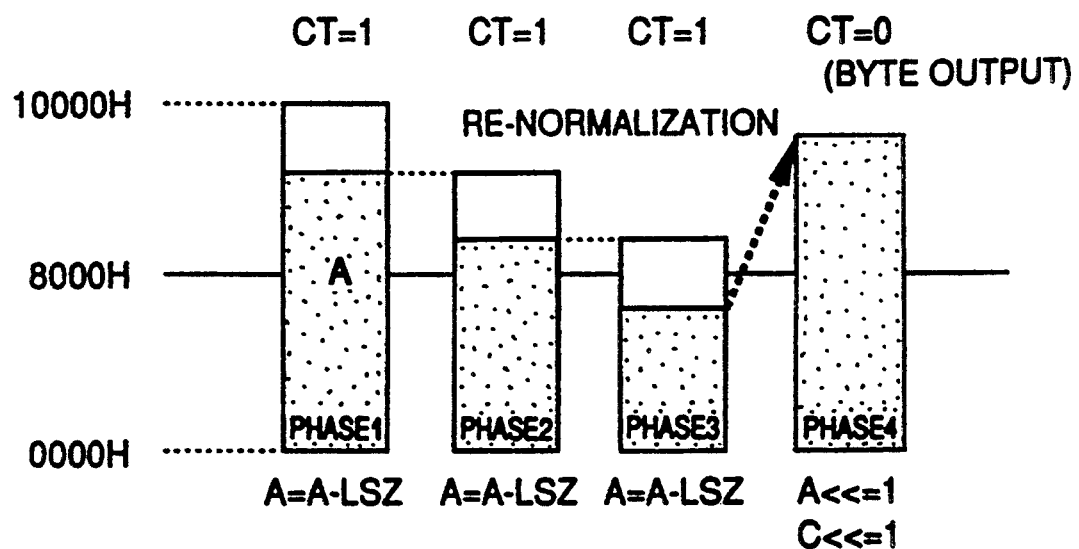
FIG. 3 is a schematic illustration showing a re-normalization operation when predictive match occurs.
Figure 4:
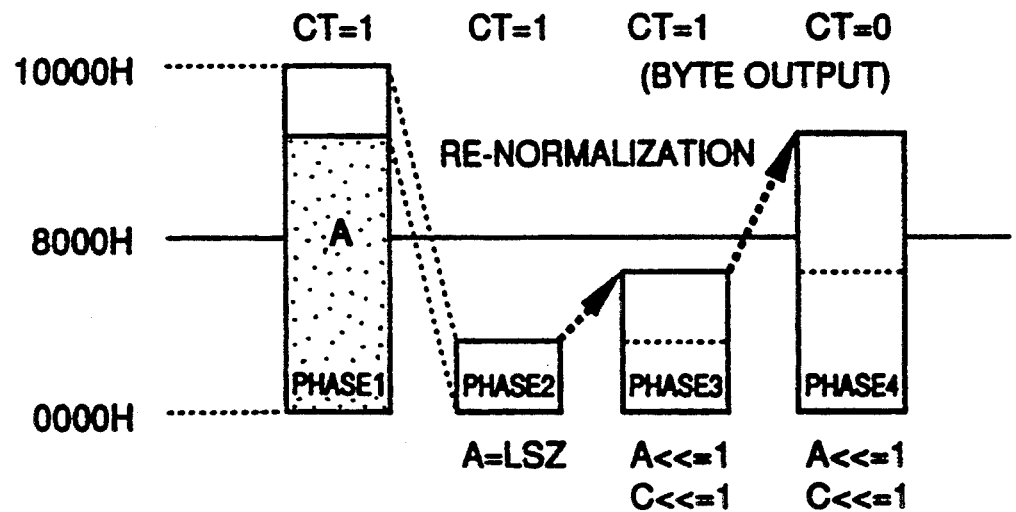
FIG. 4 is a schematic illustration showing a re-normalization operation when predictive mismatch occurs.
Figure 5:
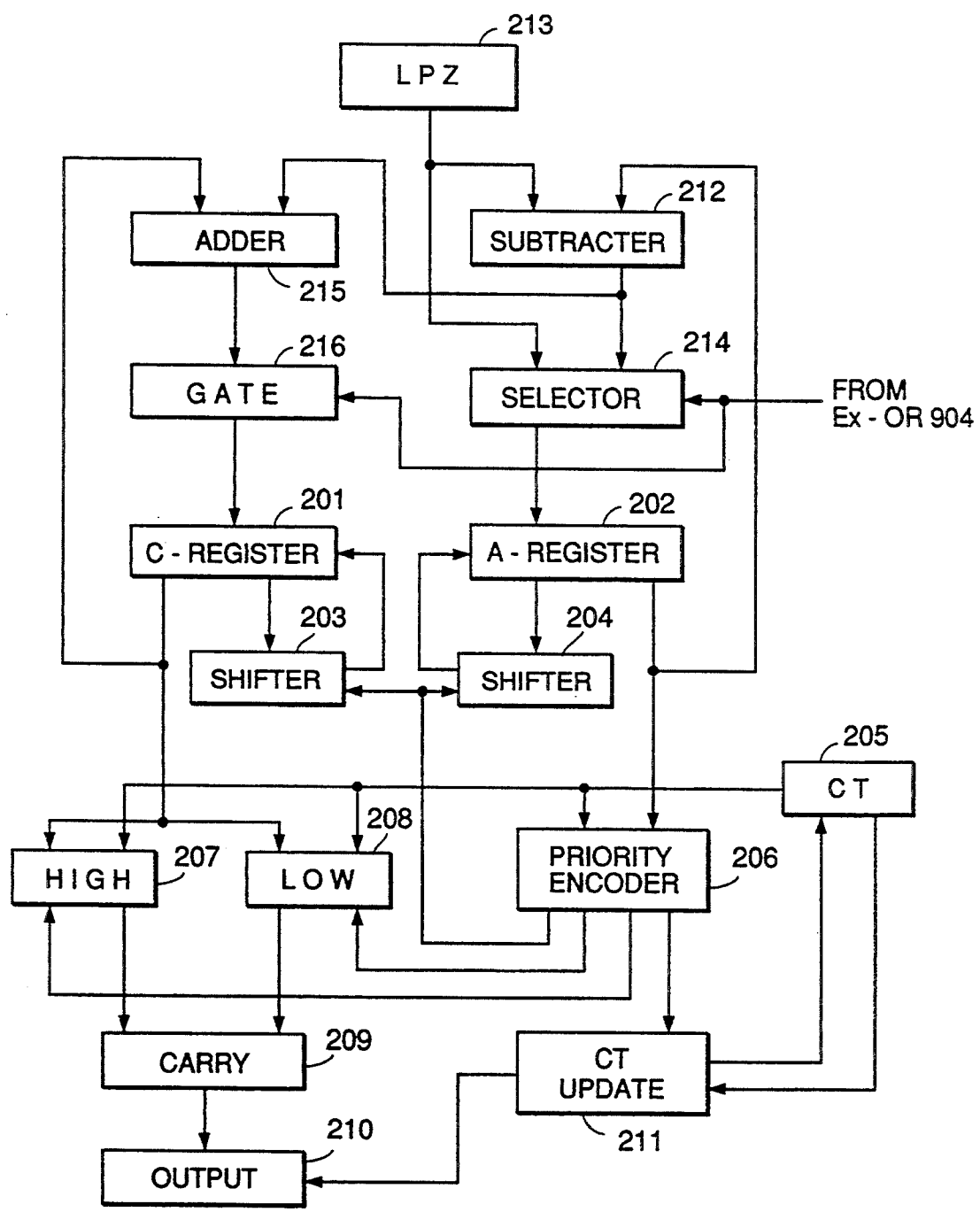
FIG. 5 is a block diagram of a coding device according to the present invention.

FIG. 5 is a construction diagram of a coding device to which the present invention is applied. The coding device shown in FIG. 1 is used in a coding device 903 shown in FIG. 1 to construct an image coding device using an arithmetic code. In FIG. 5, reference numeral 201 represents a C-register of 16 bits. Another numeral 202 represents an A20 register of 16 bits, which stores data indicating current coding interval-one of the parameters to be used for coding image data. Reference numerals 203 and 204 represent barrel shifters for bit shifts of the C-register 201 and A-register 202 respectively. A numeral 205 represents a CT-register to hold a CT value. As shown in FIG. 2A, the CT-register conducts a subtracting operation by using a counter. However, in the embodiment according to the present invention, a register for simply holding an input CT-value is used.

A priority encoder 206 receives the outputs of the A-register 202 and the CT-register 205 as inputs to the encoder 206, then controls the amount of shifts of the barrel shifters 203 and 204, and updates the value of the CT-register 205 by controlling a CT update-logic 211. Furthermore, the priority encoder 206 controls a high-byte register 207 and low-byte register 208 to conduct an output control of each 1 byte of high-order position and low-order position of the data stored in the C-register 201. Still another reference numeral 209 is a carry-control circuit which is specific to the arithmetic code.

In a subtracter 212, LPZ generated by a LPZ generator 213 is subtracted from the value of the A-register 202, and consequently the subtracted result is input to the selector 214. Another input to the selector 214 is LPZ, which is directly provided to the selector 214 from the LPZ generator 213. The selector 214 selects one of the above-mentioned two inputs in accordance with the output of an exclusive-OR gate 904 which represents match/mismatch between a target picture-element and a predictive picture-element. Accordingly, when a match occurs between the target picture-element and the predictive picture-element, the selector 214 selects the output (A-LPZ) of the subtracter 212; and when mismatch takes place, the selector 214 selects the LPZ generated by the LPZ generator 2].3. Subsequently, the value A-LPZ or the value LPZ is input to the A-register 202, and then the value of the A-register 202 is updated.

On the other hand, in an adder 215, the value of the C-register 201 is added to the output (A-LPZ) of the subtracter 212, and consequently the addition result is input to a gate 216. Subsequently, the gate 216 inputs the output of the adder 215 to the C-register 201 in accordance with the output of the exclusive-OR gate 904 which represents mismatch between the target picture-element and the predictive picture-element, thus enabling the updating of the value of the C-register 201.

Meanwhile, the value A of the A-register during the execution of re-normalization is $1 \leq A \leq 7FFFH$. Therefore, the number of bits which shift in accordance with the range of each A value can be uniformly defined. This results in "finding the bit positions closest to MSB among respective bit-positions storing the value 1 in the A-register 202." Accordingly, detection of the above-mentioned bit position is enabled by constructing a priority encoder 206 as shown in FIG. 6.

Figure 6:
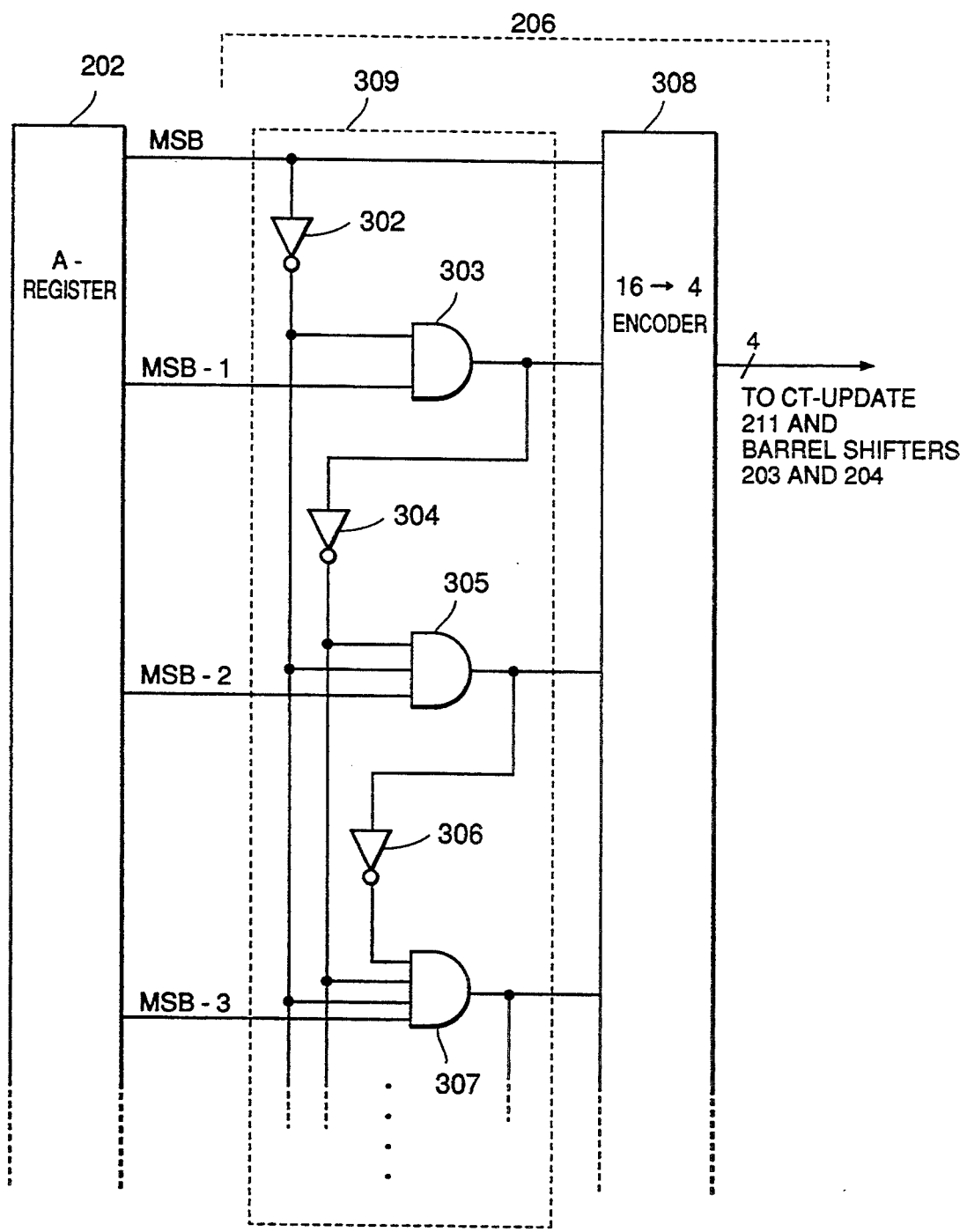
FIG. 6 is a block circuit diagram of a priority encoder.

As shown in FIG. 6, the priority encoder 206 shown in FIG. 5 consists of a logical-circuit part 309 and a $16 \rightarrow 4$ encoder 308. Each storage bit of the A-register 202 is fetched by each parallel bit and is input to the logical-circuit part 309 which comprises inverters 302, 304, 306, ... and AND-gates 303, 305, 307, .... The logical-circuit part 309 is constructed in a manner such that AND gates 303, 305, 307, ..., which correspond with the bit positions closest to MSB among respective bit-positions storing the value 1 in the A-register 202, can only execute a high-level output. For example, when data such as "0101 ..." is stored in the A-register 202, the AND gate 303 which corresponds to the second-bit output MSB-1 in the A-register 202 can execute only the high-level output. The output of each AND-gate 303, 305, 307, . . . is input Co the 16—>4 encoder 308, and then 4-bit data which represents the bit position is output from the encoder 308.

FIG. 7 shows the association between the value of the A-register at the re-normalization and the number of shifts of the A-register 202. The number of shifts from the priority encoder 206 is input to barrel shifters 203 and 204 which consequently execute the shift of the contents of the C-register 201 and the A-register 202 by 1- to 15-bit shifts at one time in accordance with the number of shifts.

Figure 9:
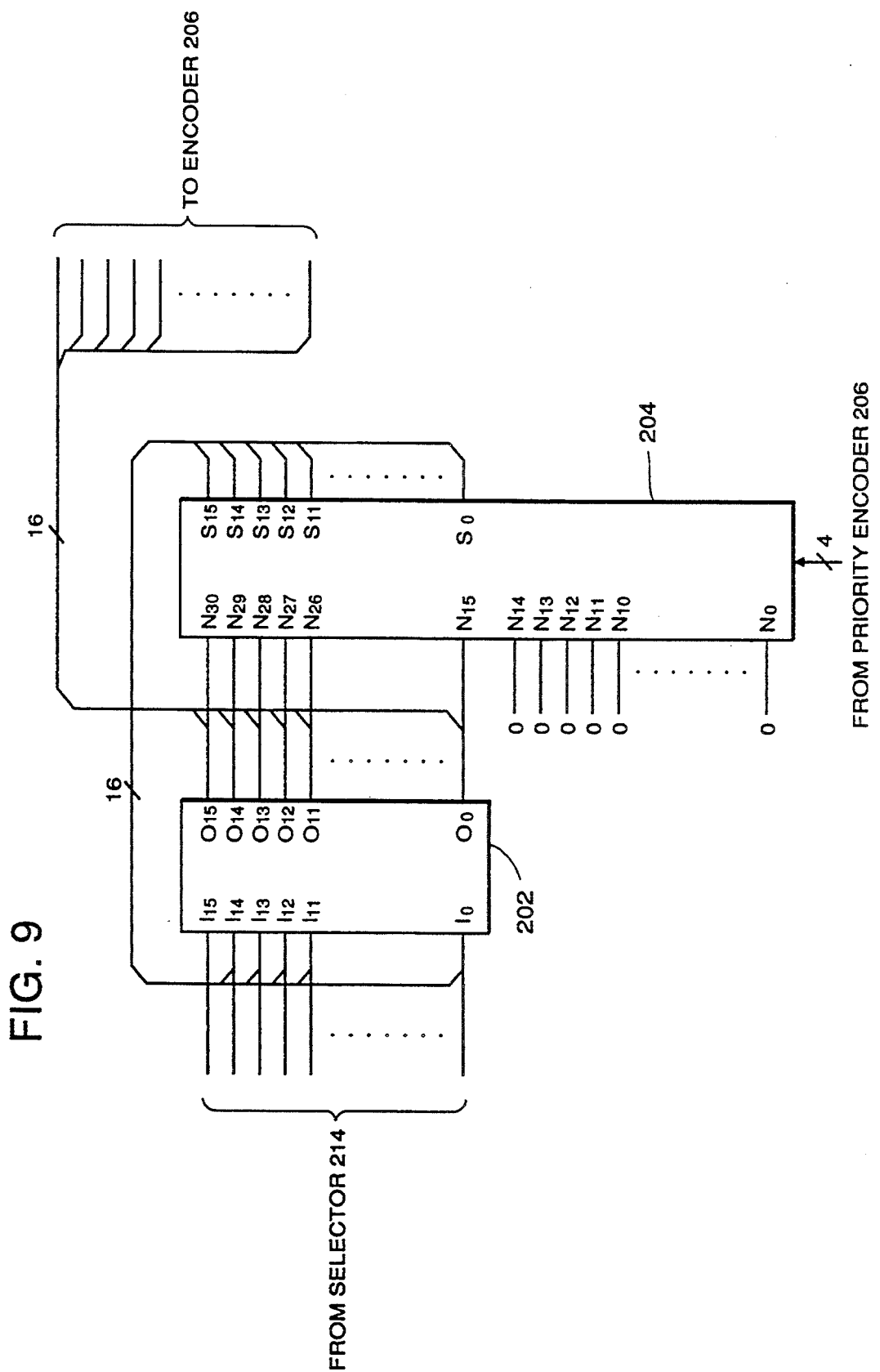
FIG. 9 is a schematic diagram showing a construction of a barrel shifter.

In FIG. 9, the construction of the barrel shifter 204 and the A-register 202 is shown. The construction of the barrel shifter 203 and the C-register 201 is the same as this.

The 16-bit data stored in the A-register 202 is input to the barrel shifter 204 in parallel. "0" is input in the low-order 15 bits of the barrel shifter 204. The number of shifts from the priority encoder 206 is input to the barrel shifter 204, which then selects and outputs arbitrarily consecutive 16-bit data in 31-bit inputs in accordance with the number of shifts. For example, when the number of shifts, 3, is input from the priority encoder 206, the barrel shifter 204 selects inputs $N_{27}$, $N_{26}$, $N_{25}$, . . ., $N_{12}$ in the 31-bit inputs, and subsequently outputs the 16-bit data in parallel to outputs $S_{15}$ through $S_0$.

The 16-bit data output in parallel from the barrel shifter 204 is input to the A-register 202 in parallel and then held there.

Consequently, the shifting of the number of bits corresponding to the number of shifts from the priority encoder 206 can be performed at one time.

The CT update-logic 211 inputs the number of shifts from the priority encoder 206 and the CT value prior to the re-normalization, and subsequently outputs the number of output bytes and the CT value after the re-normalization.

As shown in FIG. 8, a table representing the correlation between the number of shifts and CT values is provided in the CT update-logic 211. According to the table, the number of output bytes ranges from 0 to 2 when the number of shifts and the CT value range from 1 to 15, and from 1 to 8 respectively. The number of output bytes can be used for control such that an output-control part 210, as shown in FIG. 5, outputs nothing when the output byte number is 0; outputs the code of HIGH register 207 when the output byte number is 1; and outputs 2 bytes of the HIGH register 207 and the LOW register 208 when the number is 2. Meanwhile, a new CT-value is output from the CT update-logic 211 to the CT-register 205, where the value is held.

In the aforementioned manner, each bit value of a plurality of bits in the A-register is monitored in parallel, and the shift of the plurality of bits in the A-register 202 and the C-register 201 is executed at one time. Accordingly, the match/mismatch between the predictive picture-element data and the target picture-element data to be coded is examined. In addition, period required for the re-normalization can be set to be constant regardless of the contents of the A-register at that time. Therefore, synchronous coding, which can be conducted in real time with the inputting of the target picture-element data to be coded, becomes possible.

The above-mentioned preferred embodiment has been described with regard to a coding circuit using the arithmetic coding device of the subtraction type; however, it is apparent that a decoder can be made by using the equivalent construction to the coding device from the view point of the compatibility between the decoder and the coder of the arithmetic coding device.

Consequently, in the embodiment according to the present invention, the arithmetic coding device can be operable at a constant speed regardless of the re-normalization condition, thus enabling coding or decoding at a high speed.

While the present invention has been described with respect to what is presently considered to be the preferred embodiment, it is to be understood that the invention is not limited to the disclosed embodiment. To the contrary, the invention is intended to cover various modifications and equivalent arrangements included within the spirit and scope of the appended claims.

What is claimed is:

1. An image coding device for coding image data by using an arithmetic code, comprising:
    examination means for examining coincidence/non-coincidence between actual image data of a target pixel to be coded and predictive image data predicted with reference to image data of reference pixels adjacent to the target pixel;
    first register means for storing a plurality of bits of interval data to be used for coding the image data in accordance with an examination result from said examination means;
    second register means for storing a plurality of bits of code data in accordance with an examination result from said examination means;
    monitor means for monitoring the interval data stored in said first register means;
    shift means for shifting the interval data stored in said first register means and the code data stored in said second register means in accordance with a monitoring result from said monitor means, said shift means being adapted to shift the interval data and the code data by a plurality of bits at one time;
    holding means for holding an amount of shifts of the interval data executed by said shift means; and
    output control means for controlling the output of the code data from said second register means in accordance with the amount of shifts being held by said holding means and an amount of shifts of the interval data executed by said shift means.

2. An image coding device according to claim 1, wherein said monitor means detects the bit position closest to MSB among all bit positions which store value "1" in said first register means.

3. An image coding device according to claim 2, wherein said shift means shifts the interval data and the code data in accordance with the bit position detected by said monitor means.

4. An image coding device according to claim 3, wherein said shift means shifts the interval data stored in said first register means so as to move the value "1" stored at the bit position detected by said monitor means to the MSB.

5. An image coding device according to claim 1, further comprising updating means for updating the amount of shifts to be held by said holding means based upon the amount of shifts being held by said holding means and also the amount of shifts of the interval data executed by said shift means.

6. An image coding device according to claim 1, wherein said shift means shifts the interval data when the value of the interval data in said first register means is less than a predetermined value.

7. An image coding device according to claim 1, further comprising rewriting means for rewriting the interval data in said first register means in accordance with an examination result from said examination means.

8. An image coding device according to claim 1, wherein said output control means controls the amount of the code data to be output from said second register means.

9. An image coding method for coding image data by using an arithmetic code, comprising the steps of:
    an examining step of examining coincidence/non-coincidence between actual image data of a target pixel to be coded and predictive image data predicted with reference to image data of reference pixels adjacent to the target pixel;
    a storing step of storing a plurality of bits of interval data to be used for coding the image data in a first register in accordance with an examination result of the examining step;
    a storing step of storing a plurality of bits of code data in a second register in accordance with an examination result of the examining step;
    a monitoring step of monitoring the interval data stored in the first register;
    a shifting step of shifting the interval data stored in the first register and the code data stored in the second register in accordance with a monitoring result of the monitoring step, the interval data and the code data being shifted by a plurality of bits at one time;
    a holding step of holding an amount of shifts of the interval data stored in the first register; and
    a controlling step of controlling an output of the code data from the second register in accordance with the amount of shifts being held and an amount of shifts of the interval data.

10. An image coding method according to claim 9, wherein in the monitoring step, the bit position closest to MSB among all bit positions which store value "1" in the first register is detected.

11. An image coding method according to claim 10, wherein, in the shifting step, the interval data and the code data is shifted in accordance with the detected bit position.

12. An image coding method according to claim 11, wherein, in the shifting step, the interval data stored in the first register is shifted so as to move the value "1" stored at the detected bit position to the MSB.

13. An image coding method according to claim 9, wherein, in the shifting step, the interval data is shifted when the value of the interval data stored in the first register is less than a predetermined value.

14. An image coding method according to claim 9, further comprising a step of updating the amount of shifts being held based upon the amount of shifts being held and the amount of shifts of the interval data.

15. An image coding method according to claim 9, further comprising a step of rewriting the interval data in the first register in accordance with an examination result of the examining step.

16. An image coding method according to claim 9, wherein, in the controlling step, the amount of the code data to be output from the second register is controlled.

* * * * *